United States Patent
Kim et al.

(10) Patent No.: US 8,455,792 B2
(45) Date of Patent: Jun. 4, 2013

(54) LASER IRRADIATION APPARATUS AND METHOD OF MANUFACTURING DISPLAY DEVICE USING THE SAME

(75) Inventors: Hyung-Sik Kim, Yongin (KR);
Alexander Voronov, Yongin (KR);
Jin-Han Park, Yongin (KR);
Hyun-Chul Lee, Yongin (KR);
Tae-Wook Kang, Yongin (KR);
Jong-Dae Kim, Yongin (KR);
Gyoo-Wan Han, Yongin (KR);
Cheol-Lae Roh, Yongin (KR)

(73) Assignee: Samsung Display, Co., Ltd., Yongin, Gyeonggi-Do (KR)

( * ) Notice: Subject to any disclaimer, the term of this patent is extended or adjusted under 35 U.S.C. 154(b) by 355 days.

(21) Appl. No.: 12/662,799

(22) Filed: May 4, 2010

(65) Prior Publication Data

US 2010/0282724 A1    Nov. 11, 2010

(30) Foreign Application Priority Data

May 6, 2009   (KR) .................. 10-2009-0039275

(51) Int. Cl.
*B23K 26/00* (2006.01)

(52) U.S. Cl.
USPC ............. 219/121.75; 219/121.78; 219/121.82

(58) Field of Classification Search
USPC ............. 219/121.63–121.66, 121.75, 121.78, 219/121.82
See application file for complete search history.

(56) References Cited

U.S. PATENT DOCUMENTS

| | | | |
|---|---|---|---|
| 7,862,396 B2 * | 1/2011 | Lee ................................. | 445/25 |
| 7,867,907 B2 * | 1/2011 | Shimomura et al. .......... | 438/689 |
| 7,927,991 B2 * | 4/2011 | Miyairi et al. ................ | 438/584 |

FOREIGN PATENT DOCUMENTS

| | | |
|---|---|---|
| JP | 11-121166 A | 4/1999 |
| KR | 10 2002-0087265 A | 11/2002 |
| KR | 10 2007-0078500 A | 8/2007 |
| KR | 10 2008-0000013 A | 1/2008 |

OTHER PUBLICATIONS

Korean Registration Determination Certificate in KR 10-2009-0039275, dated Jun. 28, 2011 (Kim, et al.).

* cited by examiner

*Primary Examiner* — Minh-Loan T Tran
(74) *Attorney, Agent, or Firm* — Lee & Morse, P.C.

(57) ABSTRACT

A laser irradiation apparatus for bonding a first substrate and a second substrate of a display device by melting a plurality of bonding members disposed between the first and second substrates to define cells when the display device is manufactured, the display device including light emitting elements disposed on a surface of the first substrate such that the bonding members respectively encompass lateral regions of the light emitting elements, the laser irradiation apparatus including a stage on which the first substrate is mounted, a laser oscillation member configured to irradiate a laser beam that melts the bonding members disposed between the first substrate and the second substrate, and a scanner configured to irradiate the laser beam incident from the laser oscillation member onto the bonding members, the scanner being configured to sequentially irradiate the laser beam on portions of the bonding members.

17 Claims, 5 Drawing Sheets

LASER IRRADIATION APPARATUS AND METHOD OF MANUFACTURING DISPLAY DEVICE USING THE SAME

BACKGROUND

1. Field

Embodiments relate to a laser irradiation apparatus and a method of manufacturing a display device using the same.

2. Description of the Related Art

Recently, display devices have expanded to include small-sized flat panel display (FPD) devices that are mobile. Electroluminescent flat panel display devices are self-luminescent display devices may have, e.g., a wide view angle, excellent contrast and a fast response speed, and may be display devices of the next-generation. In addition, organic light emitting display devices including a light emitting layer formed of an organic material may have, e.g., excellent brightness, a better driving voltage, and a faster response speed as compared to inorganic light emitting display devices. Organic light emitting display devices may also display multiple colors.

In typical organic light emitting display devices, at least one or more organic layers including a light emitting layer may be interposed between a pair of electrodes, i.e., between first and second electrodes. The first electrode may be disposed on a substrate and may function as anode that injects holes. An organic layer may be disposed on the first electrode. The second electrode may function as cathode that injects electrons and may be disposed on the organic layer facing the first electrode.

When moisture or oxygen from the environment is introduced into a typical organic light emitting display device, the life span of the device may be reduced due to, e.g., oxidation of an electrode material or delamination. In addition, luminous efficiency may be lowered and color quality may deteriorate.

Thus, when manufacturing a typical organic light emitting display device, it may be sealed so that it may be protected from the environment, and moisture may not penetrate therein. A sealing method, including laminating organic polymer, e.g., polyethylene terephthalate (PET), on the second electrode of the typical organic light emitting display device, or forming a cover or cap of metal including a moisture absorbent material or glass, filling nitrogen gas in the cover or cap, and then encapsulating edges of the cover or cap with a sealing material, e.g., epoxy, has typically been used.

SUMMARY

Embodiments are directed to a laser irradiation apparatus and a method of manufacturing a display device using the same, which substantially overcome one or more of the drawbacks, limitations, and/or disadvantages of the related art.

It is a feature of an embodiment to provide a laser irradiation apparatus that may minimize stress generated when first and second substrates of a display device are bonded to each other with a laser.

It is another feature of an embodiment to provide a laser irradiation apparatus that may eliminate a fracture defect of a surface to be cut due to a difference in stress.

At least one of the above and other features and advantages may be realized by providing a laser irradiation apparatus for bonding a first substrate and a second substrate of a display device by melting a plurality of bonding members disposed between the first and second substrates to define cells when the display device is manufactured, the display device including light emitting elements disposed on a surface of the first substrate such that the bonding members respectively encompass lateral regions of the light emitting elements, the laser irradiation apparatus including a stage on which the first substrate is mounted, a laser oscillation member configured to irradiate a laser beam that melts the bonding members disposed between the first substrate and the second substrate, and a scanner configured to irradiate the laser beam incident from the laser oscillation member onto the bonding members, the scanner being configured to sequentially irradiate the laser beam on portions of the bonding members.

The scanner may be configured to irradiate the laser beam to the portions of the bonding members of any of the cells and then control a direction in which the laser beam is irradiated so that the laser beam is irradiated on the portions of the bonding members of the cells.

When the cells are arranged in a plurality of rows and columns, the scanner may be configured to control the direction in which the laser beam is irradiated such that the laser beam is sequentially irradiated on the portions of the bonding members of the cells of the same row.

The stage may be configured to move the first substrate in a second direction that crosses a first direction in which the laser beam is irradiated.

After the scanner is configured to irradiate the laser beam on the portions of the bonding members arranged in the first direction, the stage may be configured to move the first substrate in the second direction that crosses the first direction, so as to irradiate the laser beam on the portions of the bonding members that have not yet been irradiated.

The scanner may includes a first reflector configured to reflect the laser beam from the laser oscillation member, a first driver configured to rotate the first reflector, a second reflector configured to reflect the laser beam reflected by the first reflector so as to emit the laser beam from the scanner, and a second driver configured to rotate the second reflector.

The scanner may further include a lens configured to focus the laser beam reflected by the second reflector.

The apparatus may further include a beam blocking member configured to block the laser beam so that the laser beam does not reach the scanner and is not irradiated on the light emitting portions when the scanner irradiates the laser beam in a first direction.

The beam blocking member may be disposed between the scanner and the laser oscillation member, the beam blocking member being configured to allow the laser beam to be transmitted to the scanner when the laser beam is to be irradiated on the bonding members and being configured to prevent the laser beam from being transmitted to the scanner when the laser beam is to be irradiated on the light emitting elements.

The beam blocking member may be one of an acoustic optic module (AOM) or a chopper.

The apparatus may further include a mask disposed between the scanner and the second substrate such that the mask includes patterns corresponding to the bonding members so that the laser beam irradiates only on the bonding members.

The scanner may be configured to irradiate the laser beam in a first direction, and the stage may be configured to move the first substrate in a second direction that crosses the first direction so that the scanner irradiates the laser beam on portions of the bonding members that have not yet been irradiated after the laser beam is irradiated in the first direction.

At least one of the above and other features and advantages may also be realized by providing a method of manufacturing a display device, the method including forming a plurality of organic light emitting elements on a first surface of a first substrate, disposing a plurality of bonding members on a part of a second substrate to correspond to a section of the first surface of the first substrate so as to respectively encompass the organic light emitting elements, adhering the second substrate and the first substrate, disposing the first substrate on a stage, sequentially irradiating a laser beam on portions of the bonding members arranged in a first direction, and sequentially irradiating the laser beam on portions of the bonding members that have not yet been irradiated.

Sequentially irradiating the laser beam on portions of the bonding members arranged in the first direction may include sequentially irradiating the laser beam on portions of the bonding members of a same row when the bonding members are arranged in a plurality of rows and columns, and irradiating the laser beam on portions of the bonding members of the same row that are adjacent to the portion of the bonding members that have been irradiated.

Sequentially irradiating the laser beam on portions of the bonding members that have not yet been irradiated may include sequentially irradiating the laser beam in the first direction on portions of the bonding members that have not yet been irradiated after the laser beam is irradiated on the portions of the bonding members that are disposed in the first direction.

The method may further include moving the first substrate in a second direction that crosses the first direction after irradiating the laser beam in the first direction and sequentially irradiating of the laser beam on portions of the bonding members arranged in the first direction and prior to sequentially irradiating of the laser beam on portions of the bonding members that have not yet been irradiated.

At least one of the above and other features and advantages may also be realized by providing a laser irradiation apparatus for bonding a first substrate and a second substrate of a display device by melting a plurality of bonding members disposed between the first and second substrates, the laser irradiation apparatus including a stage configured to accommodate the first substrate and second substrate, a laser oscillating member configured to transmit a laser beam, and a scanner configured to receive the laser beam from the laser oscillation member and sequentially irradiate the laser beam in a first direction onto the bonding members disposed between the first substrate and the second substrate to melt the bonding members.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
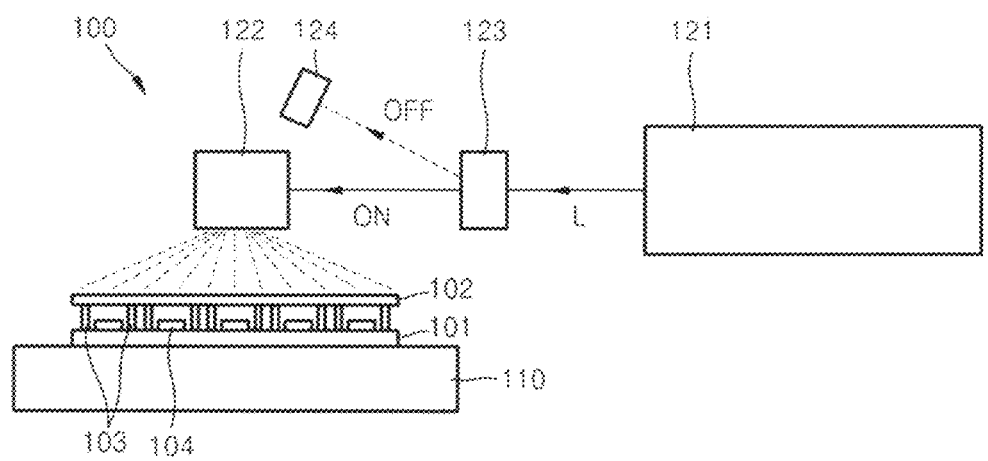
FIG. 1 illustrates a schematic view of a laser irradiation apparatus according to an embodiment.

Korean Patent Application No. 10-2009-0039275, filed on May 6, 2009, in the Korean Intellectual Property Office, and entitled: "Laser Irradiation Apparatus and Method of Manufacturing Organic Light Emitting Display Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
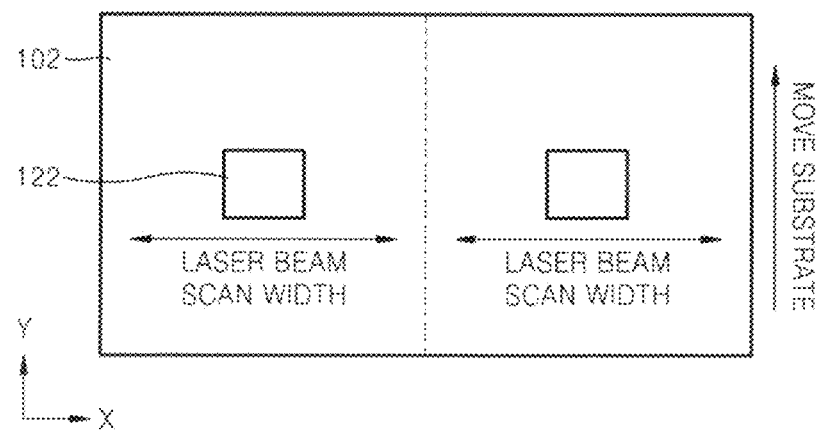
FIG. 2 illustrates a schematic plan view of the relationship of the arrangement of scanners and a second substrate of the laser irradiation apparatus of FIG. 1.
Figure 3:
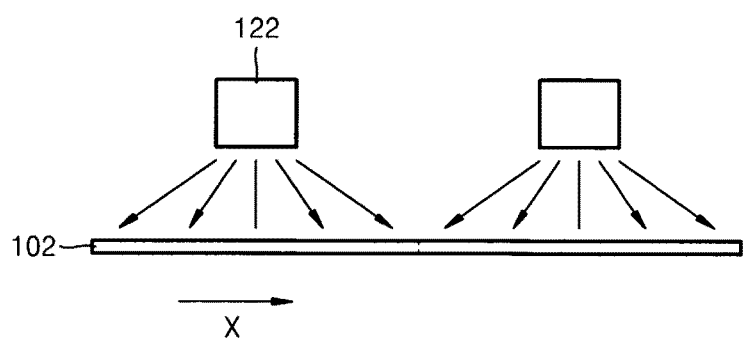
FIG. 3 illustrates a schematic side view of the relationship of the arrangement of the scanners and the second substrate of the laser irradiation apparatus of FIG. 1.

FIG. 1 illustrates a schematic view of a laser irradiation apparatus 100 according to an embodiment. FIG. 2 illustrates a schematic plan view of the relationship of the arrangement of scanners 122 and a second substrate 102 of the laser irradiation apparatus 100 of FIG. 1. FIG. 3 illustrates a schematic side view of the relationship of the arrangement of the scanners 122 and the second substrate 102 of the laser irradiation apparatus 100 of FIG. 1.

Referring to FIGS. 1 through 3, the laser irradiation apparatus 100 according to an embodiment may include a stage 110, a laser oscillation member 121, the scanners 122, a beam blocking member 123, and a beam dump 124.

A first substrate 101 and the second substrate 102 may be disposed sequentially on the stage 110. The stage 110 may fix the first substrate 101 and the second substrate 102, having bonding members 103 disposed therebetween, in position when a laser beam is irradiated thereon. The bonding members 103 may be frit. In addition, the laser beam may irradiate in a first direction and the stage 110 may move the first and second substrates 101 and 102 in a second direction that crosses the first direction. In particular, the stage 110 may move the first and second substrates 101 and 102 in the second direction that is perpendicular to the first direction. In other words, the laser beam may move in an x-axis direction and the stage 110 may move the first and second substrates 101 and 102 in a y-axis direction, as illustrated in FIG. 2. The stage 110 may move the first and second substrates 101 and 102 so that the laser beam may irradiate portions of bonding members 103 that have not yet been irradiated, as will be described below.

The laser oscillation member 121 may irradiate the laser beam in the form of a spot beam, which may melt the bonding members 103 disposed between the first substrate 101 and the second substrate 102. A multi-core source of a bundle type that is a high power laser source typically used for laser sealing may be used as the laser oscillation member 121. In the bundle type multi-core source, the output of each core may be slightly different. Even when some bundle fibers are disconnected, the bundle type multi-core source may still be used by slightly increasing a voltage so that the total output may be constant. In this case, the bundle type multi-core source may be used for a general purpose, e.g., welding metal, without a problem.

The laser beam irradiated by the laser oscillation member 121 may be incident on the scanners 122, and the scanners 122 may emit the laser beam onto the bonding members 103. In other words, the laser beam L from the laser oscillation member 121 may reach the scanner 122 and be directed towards the bonding members 103. The scanners 122 may change the direction and/or the position of the laser beam to irradiate the laser beam on other portions of the bonding members 103 that have not yet been irradiated. In other words, the scanners 122 may move the laser beam L to irradiate as yet un-irradiated portions of the bonding members 103.

Figure 4:
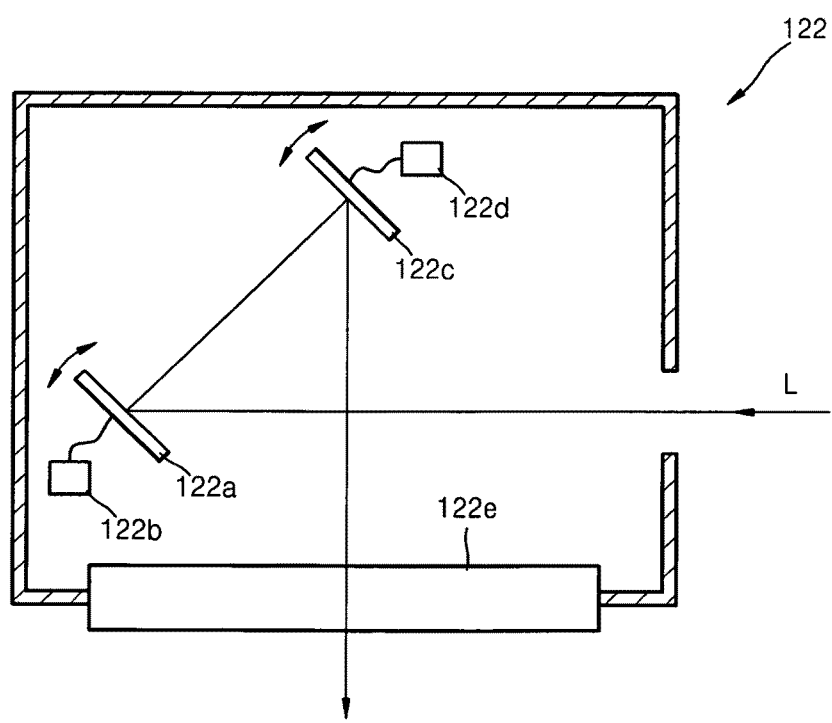
FIG. 4 illustrates a schematic view of one of the scanners of FIG. 1.

FIG. 4 illustrates a schematic view of a scanner 122 of FIG. 1. Referring to FIG. 4, the scanner 122 may include a first reflector 122a, a first driver 122b, a second reflector 122c, a second driver 122d, and a lens 122e.

As illustrated in FIG. 4, a laser beam L from the laser oscillation member 121 may enter the scanner 122 and be reflected by the first reflector 122a. The laser beam L reflected by the first reflector 122a may be directed toward the second reflector 122c. The second reflector 122c may reflect the laser beam L from the first reflector 122a to irradiate the laser beam L to the bonding members 103. The first reflector 122a and the second reflector 122c may be controlled by the first driver 122b and the second drive 122d, respectively. In other words, the first driver 122b may rotate the first reflector 122a to change a direction that the first reflector 122a reflects the laser beam L. In addition, the second driver 122d may rotate the second reflector 122c to change a direction that the second reflector 122c reflects the laser beam L. As illustrated in FIG. 3, a reflection surface of the second reflector 122c may be controlled so that the laser beam L moves in the first direction along the first and second substrates 101 and 102. Thus, the laser beam L being directionally controlled by the second reflector 122c, may sequentially irradiate portions of the bonding members 103 disposed between the first substrate 101 and the second substrate 102, as will be described below.

The lens 122e may focus the laser beam L reflected by the second reflector 122c. The laser beam L transmitted through the lens 122e may irradiate the bonding members 103 in the form of a spot beam. The lens 122e may be disposed at a lower area or portion of the scanner 122 so as to be directed toward (i.e., adjacent to) the first and second substrates 101 and 102.

The beam blocking member 123 may be disposed between the laser oscillation member 121 and the scanner 122. The laser beam L from the laser oscillation member 121 may be either blocked or transmitted by the beam blocking member 123. In other words, the beam blocking member 123 may allow the laser beam L to be transmitted to the scanner 122 when the laser beam L is to irradiate the bonding member 103. Alternatively, the beam blocking member 123 may prevent the laser beam L from reaching the scanner 122 when the scanner 122 would direct the laser beam L to a light emitting element or portion 104.

Specifically, when the laser beam L is transmitted through the beam blocking member 123, the laser beam L may thereby reach the scanner 122. The direction of the laser beam L that reaches the scanner 122 may be changed by the scanner 122 and the laser beam L may thereby irradiate the bonding members 103. When the beam blocking member 123 blocks the laser beam L, the laser beam L may not reach the scanner 122 and may instead reach the beam dump 124. Thus, when the beam blocking member 123 blocks the laser beam L, the laser beam L may not irradiate the first and second substrates 101 and 102 and the light emitting elements or portions disposed therebetween.

The second reflector 122c of the scanner 122 may rotate at a predetermined speed and may reflect the laser beam L toward the first and second substrates 101 and 102. In other words, the laser beam L reflected by the second reflector 122c may move in the first direction (x-axis direction in FIG. 2) along the first and second substrates 101 and 102. Without the beam blocking member 123, the laser beam L may irradiate and thereby damage the light emitting elements or portions 104. The beam blocking member 123 may block the laser beam L and prevent the laser beam L from reaching the scanner 122. Thus, the laser beam L may not irradiate the light emitting elements or portions 104. The beam blocking member 123 may be, e.g., an acoustic optic module (AOM) or a chopper. When the widths of the first and second substrates 101 and 102 are larger than a range that the laser beam may be irradiated by the scanner 122, as illustrated in FIGS. 2 and 3, a plurality of scanners 122 may be included in the laser irradiation apparatus 100 of an embodiment.

Figure 5:
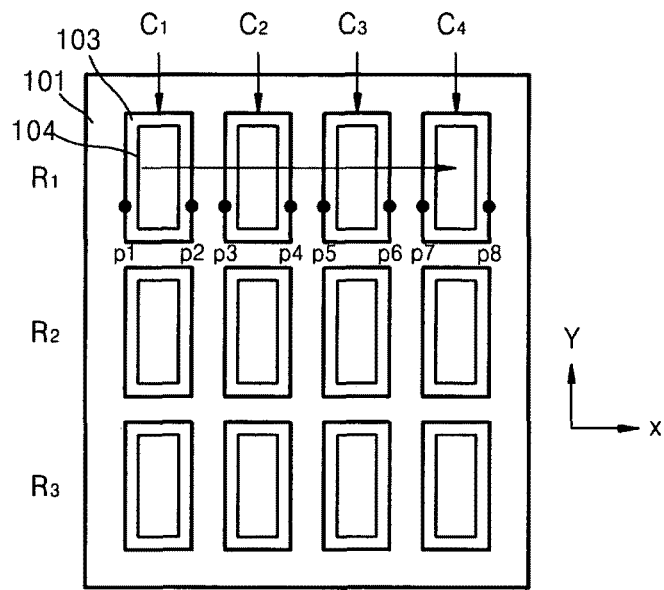
FIGS. 5 through 7 illustrate a plurality of cells arranged between first and second substrates.
Figure 6:
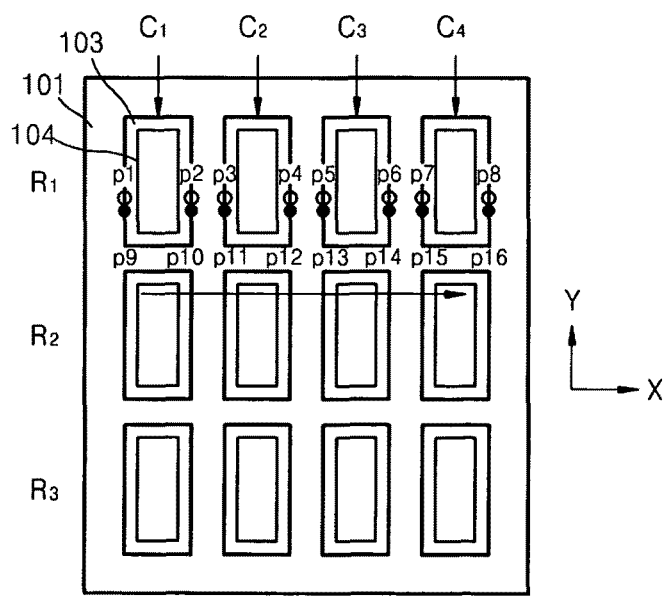
Figure 7:
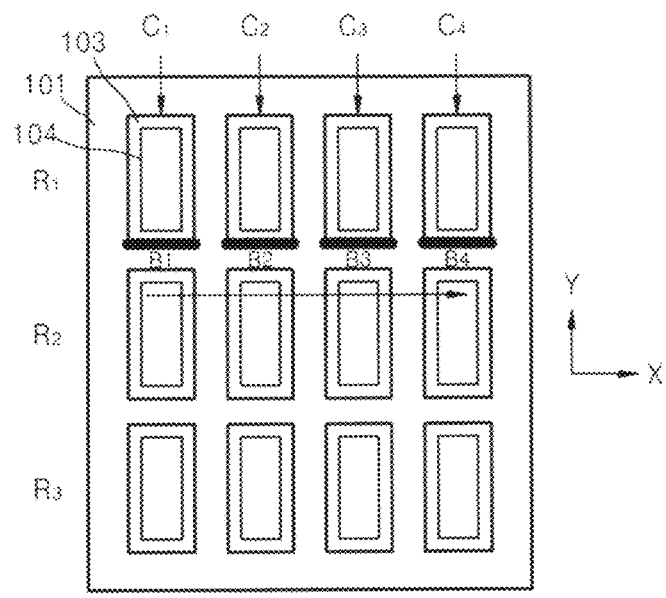

The operation of the laser irradiation apparatus 100 according an embodiment will now be described. FIGS. 5 through 7 illustrate a plurality of cells $C_1$, $C_2$, $C_3$, and $C_4$ arranged between the first substrate 101 and the second substrate 102. Each of the cells $C_1$, $C_2$, $C_3$, and $C_4$ may include the light emitting element or portion 104 having its lateral part encompassed by its respective bonding member 103. The light emitting elements or portions 104 may be organic light emitting elements or portions.

Referring to FIG. 5, the laser beam L from the laser oscillation member 121 may pass through the beam blocking member 123 and reach the scanners 122. The laser beam L may then be reflected by the first and second reflectors 122a and 122c and may irradiate a portion p1 of the bonding member 103 of the cell $C_1$. After that, the laser beam L from the scanner 122 may move in the first direction (x-axis direction in FIG. 2) by moving reflection surfaces of the first and second reflectors 122a and 122c with the first and second drivers 122b and 122d. Before the laser beam L irradiates the light emitting element or portion 104, the beam blocking member 123 may prevent the laser beam L from reaching the scanner 122. When the laser beam L is to be irradiated on a portion p2 of the bonding member 103 of the cell $C_1$, due to changed positions of the first and second reflectors 122a and 122c, the laser beam L may again be transmitted to the scanner 122 through the beam blocking member 123. The laser beam L may then be reflected by the first and second reflectors 122a and 122c of the scanner 122 and irradiate the portion p2 of the bonding member 103. In other words, when the laser beam L is to irradiate portions p1, p2, p3, p4, p5, p6, p7, and p8 of the bonding members 103, the laser beam L may be transmitted through the beam blocking member 123 to the scanner 122. Otherwise, in order to protect the light emitting elements or portions 104, the laser beam L may be blocked by the beam blocking member 123.

As described above, after the laser beam L irradiates the portions p1, p2, p3, p4, p5, p6, p7, and p8 of the bonding members 103 of the cells $C_1$, $C_2$, $C_3$, and $C_4$ of one row R1 in the first direction (x-axis direction in FIG. 5) along the first and second substrates 101 and 102, the stage 110 may move in a second direction (y-axis direction of FIGS. 5 and 6). The first and second substrates 101 and 102 disposed on the stage 110 may be moved in the second direction together with the stage 110, and the laser beam L from the laser oscillation member 121 may then irradiate portions p9, p10, p11, p12, p13, p14, p15, and p16 of the bonding members 103. As illustrated in FIG. 6, portions p9, p10, p11, p12, p13, p14, p15, and p16 may be lower relative to the portions p1, p2, p3, p4, p5, p6, p7, and p8 of the bonding members 103, which the laser beam L may have already irradiated.

FIG. 7 schematically illustrates laser beam irradiation when a plurality of portions B1, B2, B3, and B4 of the bonding members 103 are disposed in the same direction that the laser beam L irradiates. Referring to FIGS. 5 and 6, the laser beam L may be intermittently blocked and irradiated on the portions p1, p2, p3, p4, p5, p6, p7, and p8 of the bonding members 103 disposed in the second direction (y-axis direction in FIG. 7) crossing the first direction (x-axis direction in FIG. 7), in which the laser beam L is irradiated. Referring to FIG. 7, the laser beam L may continuously irradiate the portions B1, B2, B3, and B4 of the bonding members 103 disposed in the same first direction that the laser beam is irradiated. Specifically, the laser beam L may not be blocked by the beam blocking member 123 while irradiating the portion B1 of the bonding member 103. Thus, the laser beam L may continuously irradiate the portion B1 of the bonding member 103. When the laser beam L irradiates the portion B1 of the bonding member 103, the beam blocking member 123 may allow the laser beam L to be continuously transmitted to the scanner 122. The positions of the first and second reflectors 122a and 122c of the scanner 122 may be changed and the laser beam L may then irradiate portion B2 of the bonding member 103 of the cell $C_2$ adjacent to the cell $C_1$. The laser beam L reflected by the first and second reflectors 122a and 122c of the scanner 122 may then continuously irradiate the portion B2 of the bonding member 103 of the cell $C_2$. The above method may be repeated so that the laser beam L irradiates the portions B1, B2, B3, and B4 of the bonding members 103.

As described above, after the laser beam L irradiates the portions p1, p2, p3, p4, p5, p6, p7, and p8 of the bonding members 103, the laser beam L may irradiate the other portions p9, p10, p11, p12, p13, p14, p15, p16, and so on, of the bonding members 103 so that a difference in stress generated between the adjacent cells $C_1$, $C_2$, $C_3$, and $C_4$ may be minimized and a fracture defect of a surface to be cut due to the difference in stress may be eliminated. In other words, after the first substrate 101 and the second substrate 102 are bonded to each other and sealed by irradiating the bonding members 103 with the laser beam L, surfaces of the first and second substrates 101 and 102 corresponding to the cells $C_1$, $C_2$, $C_3$, and $C_4$ may be polished and the cells may be separated. When the laser irradiation apparatus 100 according to an embodiment is used, differences in stress between the cells $C_1$, $C_2$, $C_3$, and $C_4$ may be minimized so that fracture defects of the surface to be cut due to the differences in stress may be eliminated.

Figure 8:
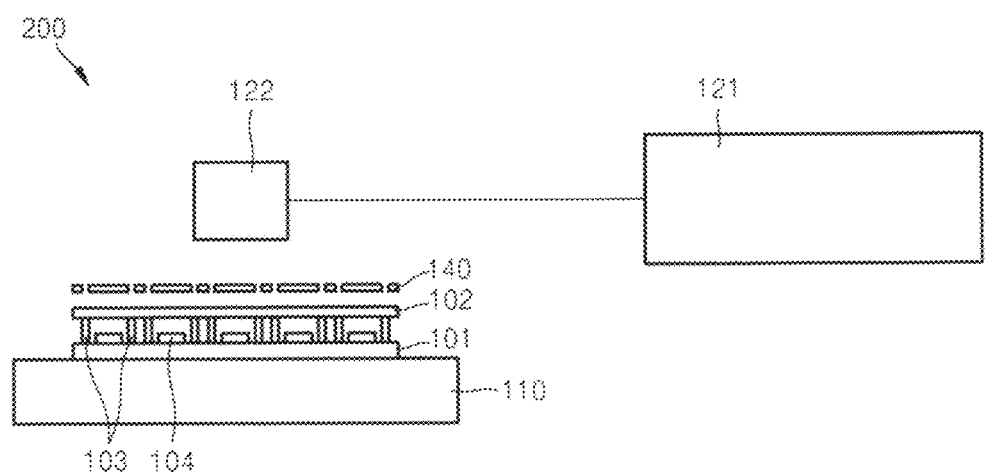
FIG. 8 illustrates a schematic view of a laser irradiation apparatus according to another embodiment.

FIG. 8 illustrates a schematic view of a laser irradiation apparatus 200 according to another embodiment. Referring to FIG. 8, the laser irradiation apparatus 200 according to the present embodiment is different from the laser irradiation apparatus 100 of FIG. 1 in that the laser irradiation apparatus 200 of FIG. 8 may not include the beam blocking member 123, and may further include a mask 140.

As mentioned above, the laser irradiation apparatus 200 according to the present embodiment may not include the beam blocking member 123. Thus, the laser beam L from the laser oscillation member 121 may reach the scanner 122, and the scanner 122 may direct the laser beam L toward the first and second substrates 101 and 102 in the first direction (x-axis direction in FIG. 2).

In this case, the laser beam L may continuously irradiate the first and second substrates 101 and 102 as well as the light emitting elements or portions 104. Thus, in order to prevent the laser beam L from damaging the light emitting elements or portions 104, the mask 140 may be disposed between the scanner 122 and the second substrate 102. The mask 140 may have a plurality of patterns corresponding to the bonding members 103 so that the laser beam L may irradiate only the bonding members 103. In particular, the laser beam L may pass through parts or portions of the mask 140 corresponding to the bonding members 103, and the laser beam L may be blocked at parts or portions of the mask 140 corresponding to the light emitting elements or portions 104. Thus, the light emitting elements or portions 104 may be protected from the laser beam L.

Hereinafter, a method of manufacturing a display device using the laser irradiation apparatus of an embodiment will be described. The method will be described with reference to FIGS. 5-7. The display device may be an organic light emitting display device.

First, the first substrate 101 and the second substrate 102 may be prepared. Light emitting elements or portions 104 may be disposed on the first substrate 101. The light emitting elements or portions 104 may be organic light emitting elements or portions. Bonding members 103 may be disposed on the second substrate 102 so as to encompass lateral regions or parts of corresponding light emitting elements or portions 104.

Next, the first substrate 101 and the second substrate 102 may be adhered to each other. When the first substrate 101 and the second substrate 102 are adhered to each other, each of the bonding members 103 may encompass the lateral region or part of its respective light emitting element or portion 104.

Then, the first and second substrates 101 and 102 with the bonding members 103 disposed therebetween may be disposed on the stage 110 of the laser irradiation apparatus 100. The stage 110 may fix the first and second substrates 101 and 102 in position when the laser beam L irradiates thereon.

Then, the laser beam L from the laser oscillation member 121 may irradiate in a first direction (x-axis direction in FIG. 2) along the first and second substrates 101 and 102 via the beam blocking member 123 and the scanners 122, as described above. The laser beam L may irradiate the portions p1, p2, p3, p4, p5, p6, p7, and p8 of the bonding members 103.

After the laser beam L irradiate the portions p1, p2, p3, p4, p5, p6, p7, and p8 of the bonding members 103, the stage 110 may be moved in a second direction (y-axis direction in FIG. 2). Then, the laser beam L may irradiate other portions, e.g., p9, p10, p11, p12, p13, p14, p15, and p16, of the bonding members 103.

The above method may be repeated so that the laser beam L may irradiate the bonding members 103 of the cells $C_1$, $C_2$, $C_3$, and $C_4$ and thereby melt the bonding members 103. Thus, a space between the first substrate 101 the second substrate 102 may be sealed.

Figure 9:
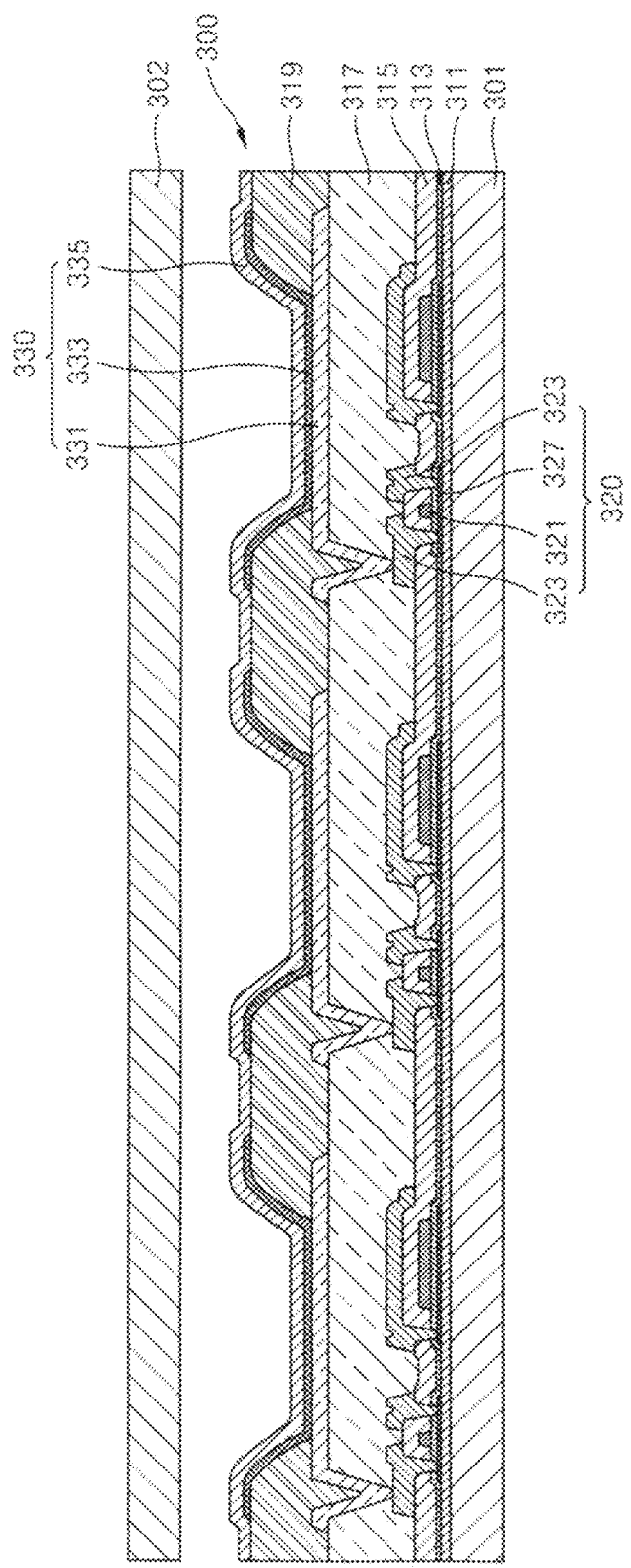
FIG. 9 illustrates a schematic cross-sectional view of part of an organic light emitting display device according to an embodiment.

FIG. 9 illustrates a schematic cross-sectional view of part of display device according to an embodiment. The display device may be an organic light emitting display device.

Referring to FIG. 9, a plurality of thin film transistors 320 may be disposed on a substrate 301. An organic light emitting diode 330 may be disposed on each of the thin film transistors 320. The organic light emitting diode 330 may include a pixel electrode 331 electrically connected to the thin film transistor 320, a counter electrode 335 disposed on an entire surface of the substrate 301, and an intermediate layer 333 disposed between the pixel electrode 331 and the counter electrode 335. The intermediate layer 333 may include at least one light emitting layer.

The thin film transistors 320 may include a gate electrode 321, a source electrode and drain electrode 323, a semiconductor layer 327, a gate insulating layer 313, and an interlevel dielectric (ILD) film 315. The thin film transistors 320 may be disposed on the substrate 301. The structure of each of the thin film transistors 320 is not limited to the structure shown in FIG. 5. That is, various types of thin film transistors, e.g., an organic thin film transistor, in which the semiconductor layer 327 is formed of an organic material, and a silicon thin film transistor, in which the semiconductor layer 327 is formed of silicon, may be used. If desired, a buffer layer 311 formed of, e.g., silicon oxide or silicon nitride, may be disposed between the thin film transistors 320 and the substrate 301.

The organic light emitting diode 330 may include the pixel electrode 331 and the counter electrode 335, which may face each other, and the intermediate layer 333 formed of an organic material and interposed between the pixel electrode 331 and the counter electrode 335. The intermediate layer 333 may include at least a light emitting layer. However, the intermediate layer 333 may include a plurality of layers, as will be described below.

The pixel electrode 331 may function as anode, and the counter electrode 335 may function as cathode. The polarity of the pixel electrode 331 and the polarity of the counter electrode 335 may be opposite to each other. The polarities of the electrodes 331 and 335 are not limited thereto, and may be reversed.

The pixel electrode 331 may be, e.g., a transparent electrode or a reflection electrode. When the pixel electrode 331 is a transparent electrode, the pixel electrode 331 may be formed of, e.g., indium tin oxide (ITO), indium zinc oxide (IZO), ZnO, or $In_2O_3$. When the pixel electrode 331 is a reflection electrode, the pixel electrode 331 may include a reflection layer formed of, e.g., Ag, Mg, Al, Pt, Pd, Au, Ni, Nd, Ir, and/or Cr, and a layer formed of, e.g., ITO, IZO, ZnO, or $In_2O_3$, on the reflection layer.

The counter electrode 335 may be a transparent electrode or a reflection electrode. When the counter electrode 335 is a transparent electrode, the counter electrode 335 may include a layer in which, e.g., Li, Ca, LiF/Ca, LiF/Al, Al, and/or Mg, is deposited adjacent to the intermediate layer 333 interposed between the pixel electrode 331 and the counter electrode 335, and an auxiliary electrode or a bus electrode line disposed on the layer and formed of a material used to form a transparent electrode, e.g., ITO, IZO, ZnO, or $In_2O_3$. When the counter electrode 335 is a reflection electrode, the counter electrode 335 may be formed by depositing, e.g., Li, Ca, LiF/Ca, LiF/Al, and/or Mg, adjacent to the intermediate layer 333 interposed between the pixel electrode 331 and the counter electrode 335.

Meanwhile, a pixel defining layer (PDL) 319 may be disposed on outer parts of the pixel electrode 331 and the counter electrode 335 to a predetermined thickness. The PDL 319 may define a light emitting region and may prevent an electric field from being concentrated on outer parts of the pixel electrode 331 by widening a distance between the outer parts of the pixel electrode 331 and the counter electrode 335. Thus, a short-circuit between the pixel electrode 331 and the counter electrode 335 may be prevented.

The intermediate layer 333 disposed between the pixel electrode 331 and the counter electrode 335 may be of various types. The intermediate layer 333 may be formed of, e.g., a small molecular organic material or a polymer organic material.

When the intermediate layer 333 is formed of a small molecular organic material, the intermediate layer 333 may be formed by, e.g., stacking a hole injection layer (HIL), a hole transport layer (HTL), an emission layer (EML), an electron transport layer (ETL), and an electron injection layer (EIL) sequentially in a single structure or multi-structure. Also, various small molecular organic materials, e.g., copper phthalocyanine (CuPc), N,N'-di(naphthalene-1-yl)-N,N'-diphenyl-benzidine (NPB), and tris-(8-hydroxyquinoline) aluminum (Alq3), may be used. The small molecular organic materials may be deposited by, e.g., vapor deposition using masks.

When the intermediate layer 333 is formed of a polymer molecular organic material, the intermediate layer 333 may have a structure formed with, e.g., the HTL and the EML. In this case, the HTL may be formed of PEDOT, and the EML may be formed of a poly-phenylenevinylene (PPV) based and polyfluorene based polymer organic material.

The organic light emitting diode 330 may be electrically connected to the thin film transistor 320 via the pixel electrode 331. In this case, when the organic light emitting display device further includes a planarization layer 317 covering the thin film transistors 320, the organic light emitting diode 330 may be disposed on the planarization layer 317, and the pixel electrode 331 of the organic light emitting diode 330 may be electrically connected to the thin film transistor 320 via a contact hole in the planarization layer 317.

The organic light emitting diode 330 may be sealed with a sealing substrate 302. The sealing substrate 302 may be formed of various materials, e.g., glass or plastics, as described above.

In a laser irradiation apparatus and a method of manufacturing a display device using the same according to an embodiment, a difference in stress generated during laser beam irradiation may be minimized, and a fracture defect of a surface to be cut may be reduced.

In a typical sealing method, harmful elements including moisture and oxygen from the environment may not be completely blocked. Thus, it may not be appropriate to utilize the typical sealing method on a top emission active matrix organic light emitting display device that is susceptible to moisture. In addition, the typical sealing method may be complicated. An encapsulation method to improve a close-adhesion property between a substrate and the cap of the organic light emitting display device using frit as a sealing material has been devised.

The organic light emitting display device may be sealed by coating frit on a glass substrate, so that the substrate and the cap of the organic light emitting display device are completely sealed, and thus, the organic light emitting display device may be more efficiently protected.

In the encapsulation method using the frit, the frit may be coated on a sealing portion of each of a plurality of organic light emitting display devices and then a laser irradiation apparatus may move and irradiate a laser beam on the sealing portion of each of the organic light emitting display devices to cure and seal the frit.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A laser irradiation apparatus for bonding a first substrate and a second substrate of a display device by melting a plurality of bonding members disposed between the first and second substrates to define cells when the display device is manufactured, the display device including light emitting elements disposed on a surface of the first substrate such that the bonding members respectively encompass lateral regions of the light emitting elements, the laser irradiation apparatus comprising:
   a stage on which the first substrate is mounted;
   a laser oscillation member configured to irradiate a laser beam that melts the bonding members disposed between the first substrate and the second substrate;
   a scanner configured to irradiate the laser beam incident from the laser oscillation member onto the bonding members, the scanner including a plurality of reflectors, and the scanner being configured to sequentially irradiate the laser beam on portions of the bonding members; and
   a beam blocking member between the laser oscillation member and the scanner, the beam blocking member being configured to intermittently block transmission of the laser beam to the scanner.

2. The apparatus as claimed in claim 1, wherein:
   the scanner is configured to irradiate the laser beam to the portions of the bonding members of any of the cells and then control a direction in which the laser beam is irradiated based on the plurality of reflectors so that the laser beam is irradiated on first and second portions of the bonding members of the cells,
   the beam blocking member is configured to transmit the laser beam to the scanner in a first period and configured to block transmission to the scanner in a second period so that the laser beam is intermittently blocked over regions including the first portions of the bonding members of the cells, and
   the beam blocking member is configured to continuously transmit the laser beam to the scanner so that the laser beam is irradiated on the second portions of the bonding members of the cells, the second portions intersecting the first portions.

3. The apparatus as claimed in claim 1, wherein, when the cells are arranged in a plurality of rows and columns, the scanner is configured to control the direction in which the laser beam is irradiated such that the laser beam is sequentially irradiated on the portions of the bonding members of the cells of the same row.

4. The apparatus as claimed in claim 1, wherein the stage is configured to move the first substrate in a second direction that crosses a first direction in which the laser beam is irradiated.

5. The apparatus as claimed in claim 4, wherein, after the scanner is configured to irradiate the laser beam on the portions of the bonding members arranged in the first direction, the stage is configured to move the first substrate in the second direction that crosses the first direction, so as to irradiate the laser beam on the portions of the bonding members that have not yet been irradiated.

6. The apparatus as claimed in claim 1, wherein the scanner includes:
   a first reflector of the plurality of reflectors that is configured to reflect the laser beam from the laser oscillation member;
   a first driver configured to rotate the first reflector;
   a second reflector of the plurality of reflectors that is configured to reflect the laser beam reflected by the first reflector so as to emit the laser beam from the scanner; and
   a second driver configured to rotate the second reflector.

7. The apparatus as claimed in claim 6, wherein the scanner further includes a lens configured to focus the laser beam reflected by the second reflector.

8. The apparatus as claimed in claim 1, wherein the beam blocking member intermittently blocks transmission of the laser beam to the scanner so that the laser beam is not irradiated on the light emitting portions when the scanner irradiates the laser beam in a first direction.

9. The apparatus as claimed in claim 8, wherein the beam blocking member is configured to allow the laser beam to be transmitted to the scanner when the laser beam is to be irradiated on the bonding members and is configured to block the laser beam from being transmitted to the scanner when the laser beam is to be irradiated on the light emitting elements.

10. The apparatus as claimed in claim 8, wherein the beam blocking member is one of an acoustic optic module (AOM) or a chopper.

11. The apparatus as claimed in claim 10, wherein the scanner is configured to irradiate the laser beam in the first direction, and the stage is configured to move the first substrate in a second direction that crosses the first direction so that the scanner irradiates the laser beam on portions of the bonding members that have not yet been irradiated after the laser beam is irradiated in the first direction.

12. A method of manufacturing a display device, the method comprising:
   forming a plurality of organic light emitting elements on a first surface of a first substrate;
   disposing a plurality of bonding members on a part of a second substrate to correspond to a section of the first surface of the first substrate so as to respectively encompass the organic light emitting elements;
   adhering the second substrate and the first substrate;
   disposing the first substrate on a stage;
   transmitting a laser beam from a laser oscillation member to a beam blocking member,
   intermittently blocking transmission of the laser beam from the beam blocking member to a scanner,
   sequentially irradiating the laser beam with a plurality of reflectors in the scanner on portions of the bonding members arranged in a first direction; and
   moving the laser beam with the plurality of reflectors in the scanner to sequentially irradiate the laser beam on portions of the bonding members that have not yet been irradiated.

13. The method as claimed in claim 12, wherein sequentially irradiating the laser beam on portions of the bonding members arranged in the first direction includes:
   sequentially irradiating the laser beam on portions of the bonding members of a same row when the bonding members are arranged in a plurality of rows and columns, and
   irradiating the laser beam on portions of the bonding members of the same row that are adjacent to the portion of the bonding members that have been irradiated.

14. The method as claimed in claim 12, wherein sequentially irradiating the laser beam on portions of the bonding members that have not yet been irradiated includes sequentially irradiating the laser beam in the first direction on portions of the bonding members that have not yet been irradiated after the laser beam is irradiated on the portions of the bonding members that are disposed in the first direction.

15. The method as claimed in claim 12, further comprising moving the first substrate in a second direction that crosses the first direction after irradiating the laser beam in the first direction and sequentially irradiating of the laser beam on portions of the bonding members arranged in the first direction and prior to sequentially irradiating of the laser beam on portions of the bonding members that have not yet been irradiated.

16. A laser irradiation apparatus for bonding a first substrate and a second substrate of a display device by melting a plurality of bonding members disposed between the first and second substrates, the laser irradiation apparatus comprising:
 a stage configured to accommodate the first substrate and second substrate;
 a laser oscillating member configured to transmit a laser beam;
 a scanner including a plurality of reflectors, the scanner being configured to receive the laser beam from the laser oscillation member and sequentially irradiate the laser beam in a first direction onto the bonding members disposed between the first substrate and the second substrate to melt the bonding members; and
 a beam blocking member between the laser oscillation member and the scanner, the beam blocking member being configured to intermittently block transmission of the laser beam to the scanner.

17. The method as claimed in claim 12, wherein:
 the laser beam is irradiated by the scanner to the portions of the bonding members arranged in a first direction and the portions of the bonding members that have not yet been irradiated so that the laser beam is irradiated on first and second portions of the bonding members,
 the laser beam is transmitted to the scanner in a first period and transmission of the laser beam to the scanner is blocked in a second period so that the laser beam is intermittently blocked over regions including the first portions of the bonding members, a
 the laser beam is continuously transmitted to the scanner so that the laser beam is irradiated on second portions of the bonding members of the cells, the second portions intersecting the first portions.

* * * * *